US012218241B2

(12) United States Patent
Ko et al.

(10) Patent No.: US 12,218,241 B2
(45) Date of Patent: Feb. 4, 2025

(54) SEMICONDUCTOR DEVICE STRUCTURE WITH ETCH STOP LAYER FOR REDUCING RC DELAY

(71) Applicant: TAIWAN SEMICONDUCTOR MANUFACTURING COMPANY, LTD., Hsinchu (TW)

(72) Inventors: Chung-Ting Ko, Kaohsiung (TW); Bo-Cyuan Lu, New Taipei (TW); Jr-Hung Li, Chupei (TW); Chi-On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 182 days.

(21) Appl. No.: 17/705,885

(22) Filed: Mar. 28, 2022

(65) Prior Publication Data

US 2022/0223736 A1 Jul. 14, 2022

Related U.S. Application Data

(63) Continuation of application No. 16/662,922, filed on Oct. 24, 2019, now Pat. No. 11,316,047, which is a (Continued)

(51) Int. Cl.
*H01L 21/02* (2006.01)
*H01L 21/768* (2006.01)
(Continued)

(52) U.S. Cl.
CPC ...... *H01L 29/7851* (2013.01); *H01L 21/0217* (2013.01); *H01L 21/022* (2013.01); (Continued)

(58) Field of Classification Search
CPC .......................................... H01L 21/00–76898
See application file for complete search history.

(56) References Cited

U.S. PATENT DOCUMENTS 6,001,726 A 12/1999 Nagabushnam et al.
6,228,732 B1 5/2001 Richardson et al.
(Continued)

FOREIGN PATENT DOCUMENTS

GB 4996081 A 2/1991

*Primary Examiner* — Didarul A Mazumder
*Assistant Examiner* — Gustavo G Ramallo
(74) *Attorney, Agent, or Firm* — Birch, Stewart, Kolasch & Birch, LLP

(57) ABSTRACT

A semiconductor device structure is provided. The semiconductor device structure includes a substrate and a gate structure over the substrate. The semiconductor device structure also includes a spacer element covering a first sidewall of the gate structure. The semiconductor device structure further includes a source/drain portion in the substrate, and the spacer element is between the source/drain portion and the gate structure. In addition, the semiconductor device structure includes an etch stop layer covering the source/drain portion. The etch stop layer includes a first nitride layer covering the source/drain portion and having a second sidewall, and the second sidewall is in direct contact with the spacer element. The etch stop layer also includes a first silicon layer covering the first nitride layer and having a third sidewall, and the third sidewall is in direct contact with the spacer element.

20 Claims, 13 Drawing Sheets

3000
130B
130A
130C
132A
134A
136A
124
114
140
126
126
114
136B
134B
132B
136C
134C
132C
122
120
100
118
118

Related U.S. Application Data continuation of application No. 15/646,386, filed on Jul. 11, 2017, now Pat. No. 10,468,529.

(51) Int. Cl.

| | |
|---|---|
| ***H01L 23/535*** | (2006.01) |
| ***H01L 29/04*** | (2006.01) |
| ***H01L 29/08*** | (2006.01) |
| ***H01L 29/165*** | (2006.01) |
| ***H01L 29/66*** | (2006.01) |
| ***H01L 29/78*** | (2006.01) |
| *H01L 21/8234* | (2006.01) |
| *H01L 27/088* | (2006.01) |
| *H01L 29/06* | (2006.01) |
| *H01L 29/51* | (2006.01) |

(52) U.S. Cl.

CPC .. *H01L 21/02211* (2013.01); *H01L 21/02247* (2013.01); *H01L 21/02252* (2013.01); *H01L 21/0228* (2013.01); *H01L 21/76829* (2013.01); *H01L 23/535* (2013.01); *H01L 29/04* (2013.01); *H01L 29/0847* (2013.01); *H01L 29/165* (2013.01); *H01L 29/66545* (2013.01); *H01L 29/66795* (2013.01); *H01L 29/7848* (2013.01); *H01L 21/76897* (2013.01); *H01L 21/823431* (2013.01); *H01L 21/823468* (2013.01); *H01L 21/823475* (2013.01); *H01L 21/823481* (2013.01); *H01L 27/0886* (2013.01); *H01L 29/0649* (2013.01); *H01L 29/517* (2013.01); *H01L 29/6656* (2013.01)

(56) References Cited

U.S. PATENT DOCUMENTS

| | | | | |
|---|---|---|---|---|
| 6,455,433 | B1 * | 9/2002 | Chang | H01L 29/6659 438/692 |
| 6,638,879 | B2 | 10/2003 | Hsieh et al. | |
| 7,112,495 | B2 | 9/2006 | Ko et al. | |
| 8,772,109 | B2 | 7/2014 | Colinge | |
| 8,785,285 | B2 | 7/2014 | Tsai et al. | |
| 8,816,444 | B2 | 8/2014 | Wann et al. | |
| 8,823,065 | B2 | 9/2014 | Wang et al. | |
| 8,860,148 | B2 | 10/2014 | Hu et al. | |
| 9,105,490 | B2 | 8/2015 | Wang et al. | |
| 9,236,267 | B2 | 1/2016 | De et al. | |
| 9,236,300 | B2 | 1/2016 | Liaw | |
| 9,520,482 | B1 | 12/2016 | Chang et al. | |
| 9,576,814 | B2 | 2/2017 | Wu et al. | |
| 10,777,637 | B2 | 9/2020 | Yu et al. | |
| 2004/0178419 | A1 | 9/2004 | Song | |
| 2004/0180536 | A1 | 9/2004 | Fujiwara et al. | |
| 2005/0266639 | A1 | 12/2005 | Frohberg et al. | |
| 2007/0152294 | A1 | 7/2007 | Nanda et al. | |
| 2009/0294800 | A1 | 12/2009 | Cheng et al. | |
| 2011/0147828 | A1 * | 6/2011 | Murthy | H01L 29/66795 257/E21.409 |
| 2012/0126331 | A1 * | 5/2012 | Lin | H01L 29/66477 438/300 |
| 2015/0069473 | A1 * | 3/2015 | Glass | H01L 29/785 257/288 |
| 2015/0171084 | A1 | 6/2015 | Lin et al. | |
| 2016/0163861 | A1 * | 6/2016 | Park | H01L 29/66545 257/192 |
| 2016/0181092 | A1 | 8/2016 | Ganz | |
| 2016/0372413 | A1 | 12/2016 | Mahalingam et al. | |
| 2017/0222008 | A1 | 8/2017 | Hsu et al. | |
| 2017/0243952 | A1 | 8/2017 | Kuo | |

* cited by examiner

SEMICONDUCTOR DEVICE STRUCTURE WITH ETCH STOP LAYER FOR REDUCING RC DELAY

CROSS REFERENCE

This application is a Continuation of U.S. application Ser. No. 16/662,922, filed on Oct. 24, 2019, which is a Continuation of U.S. application Ser. No. 15/646,386, filed on Jul. 11, 2017, the entirety of which are incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

Despite groundbreaking advances in materials and fabrication, scaling planar devices such as the metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short channel effect, reduced leakage, and higher current flow.

However, since feature sizes continue to decrease, fabrication processes continue to become more difficult to perform. Therefore, it is a challenge to form a reliable semiconductor device including the FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
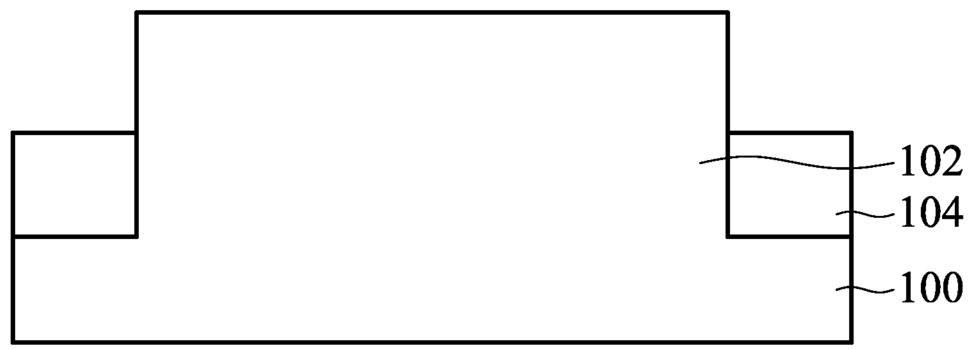
FIGS. 1A-1J are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Moreover, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A-1J are cross-sectional views of various stages of a process for forming a semiconductor device structure, in accordance with some embodiments. As shown in FIG. 1A, a fin structure 102 is formed over a semiconductor substrate 100, in accordance with some embodiments.

In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable material, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, the semiconductor substrate 100 is an un-doped substrate. However, in some other embodiments, the semiconductor substrate 100 is a doped substrate such as a P-type substrate or an N-type substrate.

In some embodiments, the semiconductor substrate 100 includes various doped regions (not shown) depending on design requirements of the semiconductor device. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

In some embodiments, multiple recesses (or trenches) are formed in the semiconductor substrate 100. As a result, the fin structure 102 is formed between the recesses. In some embodiments, one or more photolithography and etching processes are used to form the recesses.

As shown in FIG. 1A, one or more isolation structures including isolation structures 104 are formed over the semiconductor substrate 100 and formed in the recesses to surround lower portion of the fin structure 102, in accordance with some embodiments. The isolation structures 104 are adjacent to the fin structure 102. In some embodiments, the isolation structures 104 continuously surround the lower portion of the fin structure 102. Upper portion of the fin structure 102 protrudes from the top surfaces of the isolation features 104.

The isolation structures 104 are used to define and electrically isolate various device elements formed in and/or over the semiconductor substrate 100. In some embodiments, the isolation structure 104 includes a shallow trench isolation (STI) feature, a local oxidation of silicon (LOCOS) feature, another suitable isolation structure, or a combination thereof.

In some embodiments, the isolation structures 104 have a multi-layer structure. In some embodiments, the isolation structures 104 are made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation structures 104. The STI liner may also be used to reduce crystalline defects at the interface between the fin structures and the isolation structures 104.

It should be noted that, the term "silicon nitride" herein means $Si_xN_y$, where x is generally 3 but may also be 4 or any other number which indicates a number of atoms of silicon that will form a stable compound with y nitrogen atoms, and y is usually 4 but may be any other number that represents a number of nitrogen atoms that will form a stable compound with x silicon atoms.

In some embodiments, a dielectric layer is deposited over the semiconductor substrate 100 using a chemical vapor deposition (CVD) process, a spin-on process, another applicable process, or a combination thereof. The dielectric layer covers the fin structure 102 and fills the recesses between the fin structures. In some embodiments, a planarization process is performed to thin down the dielectric layer. For example, the dielectric layer is thinned until the fin structure 102 is exposed. The planarization process may include a chemical mechanical polishing (CMP) process, a grinding process, a dry polishing process, an etching process, another applicable process, or a combination thereof. Afterwards, the dielectric layer is etched back to be below the top of the fin structure 102. As a result, the isolation structures 104 are formed. The fin structure 102 protrudes from the top surface of the isolation structures 104, as shown in FIG. 1A in accordance with some embodiments.

Figure 1B:
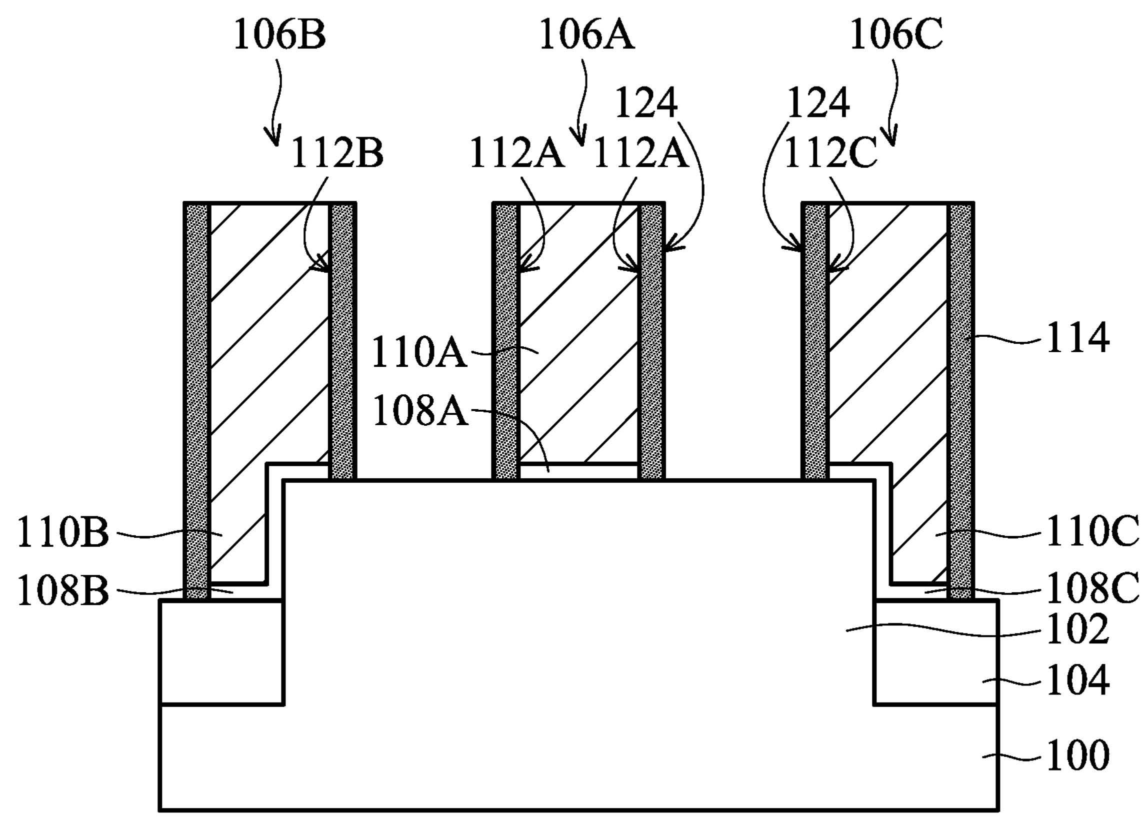

As shown in FIG. 1B, one or more gate structures are formed over the semiconductor substrate 100 and the fin structure 102, in accordance with some embodiments. To simplify the diagram, only three gate structure, namely the first gate structure 106A, the second gate structure 106B and the third gate structure 106C, are depicted. The semiconductor device structure may include fewer or more gate structures.

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer, portion or section. Thus, a first element, component, region, layer, portion or section discussed below could be termed a second element, component, region, layer, portion or section without departing from the teachings of the present disclosure.

As shown in FIG. 1B, the first gate structure 106A is formed over the top surface of the fin structure 102, in accordance with some embodiments. As shown in FIG. 1B, the first gate structure 106A includes a first gate dielectric layer 108A over the top surface of the fin structure 102 of the semiconductor substrate 100 and a first gate electrode 110A over the first gate dielectric layer 108A, in accordance with some embodiments.

As shown in FIG. 1B, the second gate structure 106B and third gate structure 106C are positioned at opposite ends of the fin structure 102, in accordance with some embodiments. As shown in FIG. 1B, the first gate structure 106A is positioned between the second gate structure 106B and third gate structure 106C, in accordance with some embodiments.

As shown in FIG. 1B, the second gate structure 106B is formed over a portion of the top surface of the fin structure 102, over the side surface of the fin structure 102 at one end of the fin structure 102, and over the isolation structure 104, in accordance with some embodiments. As shown in FIG. 1B, the third gate structure 106C is formed over a portion of the top surface of the fin structure 102, over the side surface of the fin structure 102 at the other end of the fin structure 102, and over the isolation structure 104, in accordance with some embodiments.

As shown in FIG. 1B, the second gate structure 106B includes a second gate dielectric layer 108B over a portion of the top surface of the fin structure 102, over the side surface of the fin structure 102 at one end of the fin structure 102, and over the isolation structure 104, in accordance with some embodiments. As shown in FIG. 1B, the second gate structure 106B further includes a second gate electrode 110B over the second gate dielectric layer 108B, in accordance with some embodiments.

Still referring to FIG. 1B, the third gate structure 106C includes a third gate dielectric layer 108C over a portion of the top surface of the fin structure 102, over the side surface of the fin structure 102 at the other end of the fin structure 102, and over the isolation structure 104, in accordance with some embodiments. As shown in FIG. 1B, the third gate structure 106C further includes a third gate electrode 110C over the third gate dielectric layer 108C, in accordance with some embodiments.

In some embodiments, each of the gate dielectric layers 108A, 108B and 108C is made of silicon oxide, silicon nitride, silicon oxynitride, high-k material, another suitable dielectric material, or a combination thereof. In some embodiments, the high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$ (BTO), BaZrO, $HfO_2$, $HfO_3$, HfZrO, HfLaO, HfSiO, HfSiON, LaSiO, AlSiO, HfTaO, HfTiO, HfTaTiO, HfAlON, (Ba,Sr)$TiO_3$(BST), $Al_2O_3$, another suitable high-k dielectric material, or a combination thereof.

In some embodiments, each of the gate electrodes 110A, 110B and 110C is made of polysilicon, a metal material, another suitable conductive material, or a combination thereof. In some embodiments, the metal material may include, but is not limited to, copper, aluminum, gold, tungsten, molybdenum, titanium, tantalum, platinum, or hafnium.

In some embodiments, the gate structures 106A, 106B and 106C are dummy gate structures. In some embodiments, the gate dielectric layers 108A, 108B and 108C are dummy gate dielectric layers and will be replaced with other gate dielectric layers. In some embodiments, the first gate electrode 110A, 110B and 110C are dummy gate electrodes and will be replaced with another conductive material such as a metal material. The dummy gate electrode layer is made of, for example, polysilicon.

In some embodiments, a gate dielectric material layer (not shown) and a gate electrode material layer (not shown) are sequentially deposited over the semiconductor substrate 100, the fin structure 102 and the isolation structure 104. In some embodiments, the gate dielectric material layer and the gate electrode material layer are sequentially deposited by using applicable deposition methods. In some embodiments, the applicable deposition methods for depositing the gate dielectric material layer may include a chemical vapor deposition (CVD) process, an atomic layer deposition (ALD) process, a thermal oxidation process, a spin-on coating process, another applicable process, or a combination thereof. In some embodiments, the applicable deposition methods for depositing the gate electrode material layer may include a chemical vapor deposition (CVD), a physical vapor deposition (PVD) process, or another applicable method.

Afterwards, according to some embodiments of the present disclosure, the gate dielectric material layer and the gate electrode material layer are patterned to form the first gate structure 106A including the first gate dielectric layer 108A and the first gate electrode 110A, form the second gate structure 106B including the second gate dielectric layer 108B and the second gate electrode 110B, and form the third gate structure 106C including the third gate dielectric layer 108C and the third gate electrode 110C.

Still referring to FIG. 1B, the first gate structure 106A has sidewalk 112A, the second gate dielectric layer 108B has sidewalls 112B, and the third gate structure 106C has sidewalls 112C, in accordance with some embodiments.

Afterwards, as shown in FIG. 1B, spacer elements 114 are formed over the sidewalk 112A of the first gate structure 106A, the sidewalls 112B of the gate structure 106B and the sidewalls 112C of the third gate structure 106C, in accordance with some embodiments. The spacer elements 114 may be used to assist in a subsequent formation of source/drain portions. In some embodiments, the spacer elements 114 include one or more layers.

In some embodiments, the spacer elements 114 are made of a dielectric material. The dielectric material may include silicon oxide, silicon nitride, silicon oxynitride, another suitable material, or a combination thereof. In some embodiments, the spacer elements 114 are made of a carbon-containing dielectric material. In some embodiments, the carbon-containing dielectric material includes carbon-containing silicon oxide, carbon-containing silicon nitride, carbon-containing silicon oxynitride, another suitable material, or a combination thereof. In some embodiments, the spacer elements 114 are low-k spacer elements. In some embodiments, the spacer elements 114 have an amorphous structure.

It should be noted that, the term "silicon oxide" means and includes silicon dioxide ("$SiO_2$"), silicon oxide ("SiO"), TEOS, a silicon-rich silicon oxynitride, atomic layer deposition ("ALD") SiO or $SiO_2$, or other silicon oxide-based material.

In some embodiments, a spacer material layer is deposited over the gate structures 106A, 106B and 106C using a CVD process, a PVD process, a spin-on process, another applicable process, or a combination thereof. Afterwards, the spacer material layer is partially removed using an etching process, such as an anisotropic etching process. As a result, the remaining portions of the spacer material layer over the sidewalls 112A of the first gate structure 106A, the sidewalls 112B of the gate structure 106B and the sidewalls 112C of the third gate structure 106C form the spacer elements 114.

Figure 1C:
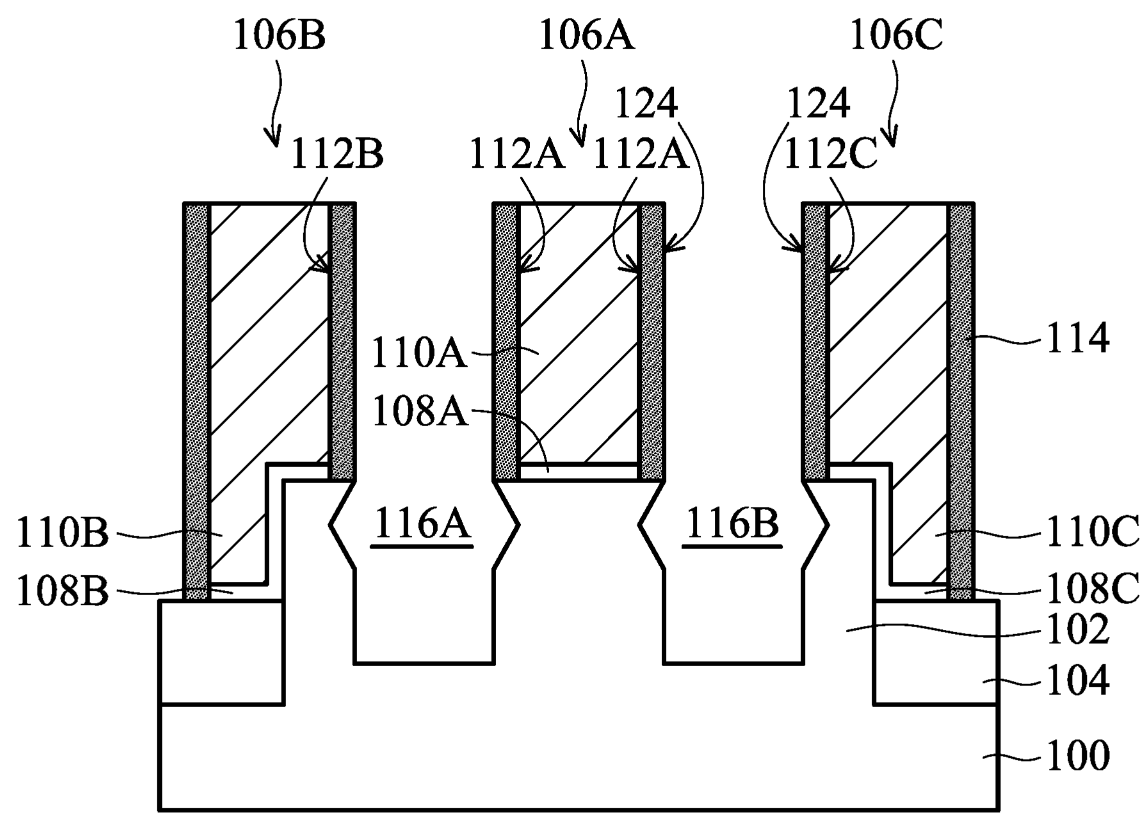

As shown in FIG. 1C, portions of the semiconductor substrate 100 are removed to form a first recess 116A and a second recess 116B in the semiconductor substrate 100, in accordance with some embodiments. As shown in FIG. 1C, the first recess 116A and the second recess 116B extend into the semiconductor substrate 100 from a surface of the semiconductor substrate 100, in accordance with some embodiments.

As shown in FIG. 1C, the first recess 116A and the second recess 116B are at opposite sides of the first gate structure 106A, in accordance with some embodiments. As shown in FIG. 1C, the first recess 116A is between the first gate structure 106A and the second gate structure 106B, in accordance with some embodiments. As shown in FIG. 1C, the second recess 116B is between the first gate structure 106A and the third gate structure 106C, in accordance with some embodiments. In some embodiments, a photolithography process and an etching process are performed to form the first recess 116A and the second recess 116B.

Figure 1D:
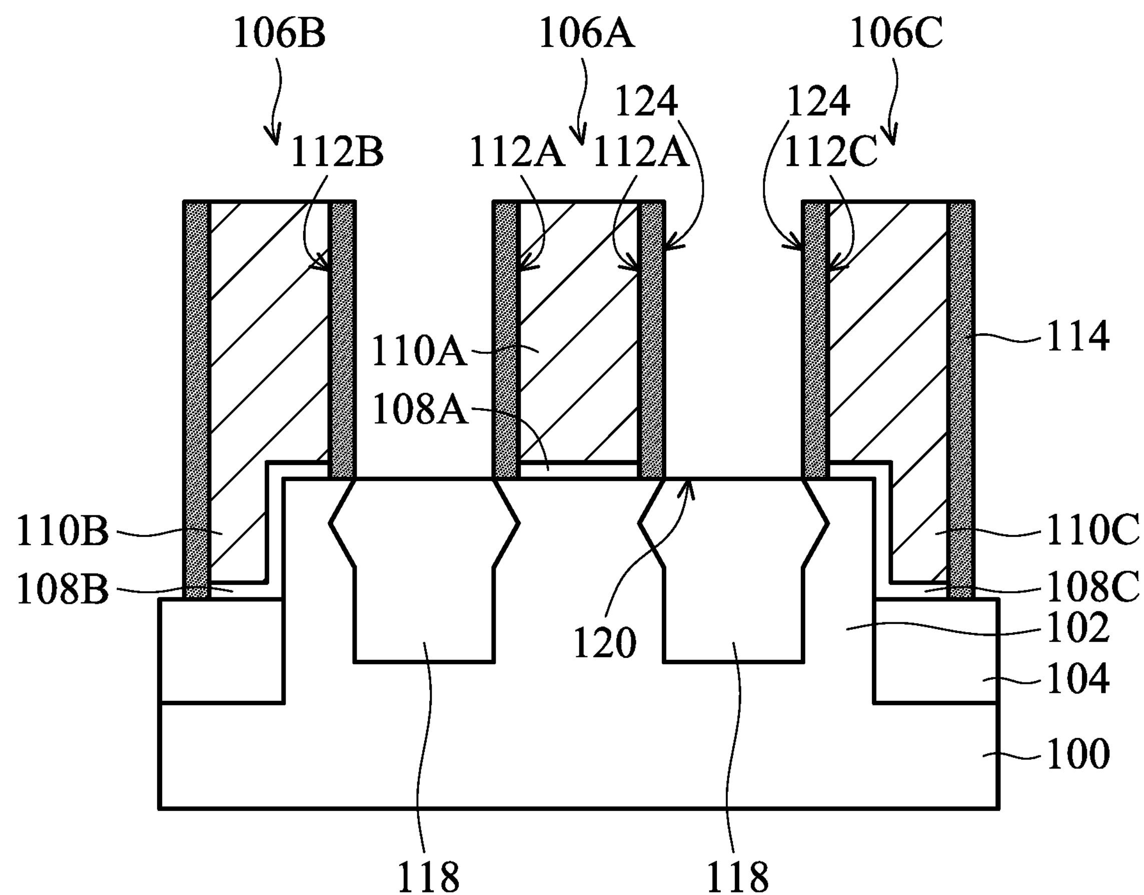

Afterwards, as shown in FIG. 1D, source/drain portions including source/drain portions 118 are formed in the fin structure 102 of the semiconductor substrate 100, in accordance with some embodiments. As shown in FIG. 1D, two source/drain portions 118 are formed in the first recess 116A and the second recess 116B respectively, in accordance with some embodiments. As shown in FIG. 1D, the source/drain portion 118 extends under the spacer elements 114, in accordance with some embodiments.

As shown in FIG. 1D, one of the two source/drain portions 118 is formed between the first gate structure 106A and the second gate structure 106B. As shown in FIG. 1D, this source/drain portion 118 is formed adjacent to the first gate structure 106A and the second gate structure 106B and adjacent to the spacer elements 114 over the sidewalls 112A of the first gate structure 106A and the sidewalls 112B of the gate structure 106B, in accordance with some embodiments.

As shown in FIG. 1D, another one of the two source/drain portions 118 is formed between the first gate structure 106A and the third gate structure 106C, as shown in FIG. 1D, in accordance with some embodiments. As shown in FIG. 1D, this source/drain portion 118 is formed adjacent to the first gate structure 106A and the third gate structure 106C and adjacent to the spacer elements 114 over the sidewall 112A of the first gate structure 106C and the sidewall 112C of the third gate structure 106C, in accordance with some embodiments.

In some embodiments, a semiconductor material is epitaxially grown in the first recess 116A and the second recess 116B to form the source/drain portions 118. In some embodiments, the source/drain portion 118 is made of silicon, silicon germanium, silicon phosphide, or a combination thereof. In some embodiments, the source/drain portions 118 are an n-type semiconductor material. The source/drain portions 118 may include epitaxially grown silicon, epitaxially grown silicon phosphide (SiP), or another applicable epitaxially grown semiconductor material. The source/drain portions 118 are not limited to being an n-type semiconductor material. In some other embodiments, the source/drain portions 118 are made of a p-type semiconductor material. For example, the source/drain portions 118 may include epitaxially grown silicon germanium.

In some embodiments, the source/drain portions 118 impart stress or strain to the channel region under the gate structure 106A to enhance the carrier mobility of the device and improve device performance.

In some embodiments, the source/drain portions 118 have a crystalline structure. In some embodiments, the source/drain portions 118 have a single crystalline structure. As shown in FIG. 1D, the source/drain portion 118 has a top surface 120, in accordance with some embodiments.

Figure 1E:
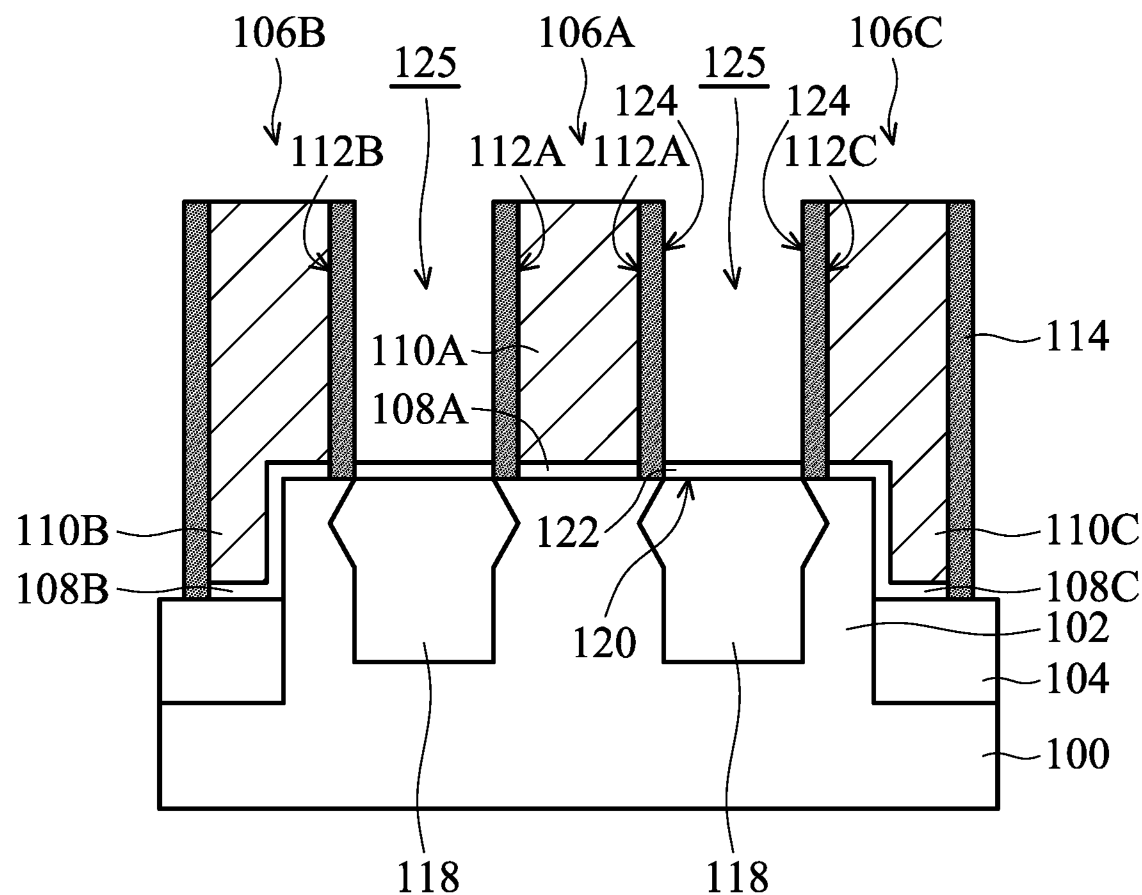

Afterwards, as shown in FIG. 1E, an etch stop layer 122 is deposited over the top surface 120 of the source/drain portion 118 by performing an atomic layer deposition process, in accordance with some embodiments. In some embodiments, in the atomic layer deposition process, the etch stop layer 122 is grown from or deposited over the top surface 120 of the source/drain portion 118. In some embodiments, in the atomic layer deposition process, the etch stop layer 122 is not grown from or deposited over the side surface 124 of the spacer elements 114. Therefore, as shown in FIG. 1E, the etch stop layer 122 exposes the spacer elements 114, in accordance with some embodiments.

In some embodiments, before the atomic layer deposition process is performed, an etching process is performed to remove the native oxide over the top surface 120 of the source/drain portion 118. However, embodiments of the disclosure are not limited thereto. In some other embodiments, this etching process is not performed.

In some embodiments, the etch stop layer 122 is made of silicon nitride. However, embodiments of the disclosure are not limited thereto. In some other embodiments, the etch stop layer 122 is made of other suitable material.

In some embodiments, the etch stop layer 122 is formed by the process shown in FIGS. 2A-2E. FIGS. 2A-2E are cross-sectional views of various stages of a process for forming the etch stop layer 122, in accordance with some embodiments.

Figure 2A:
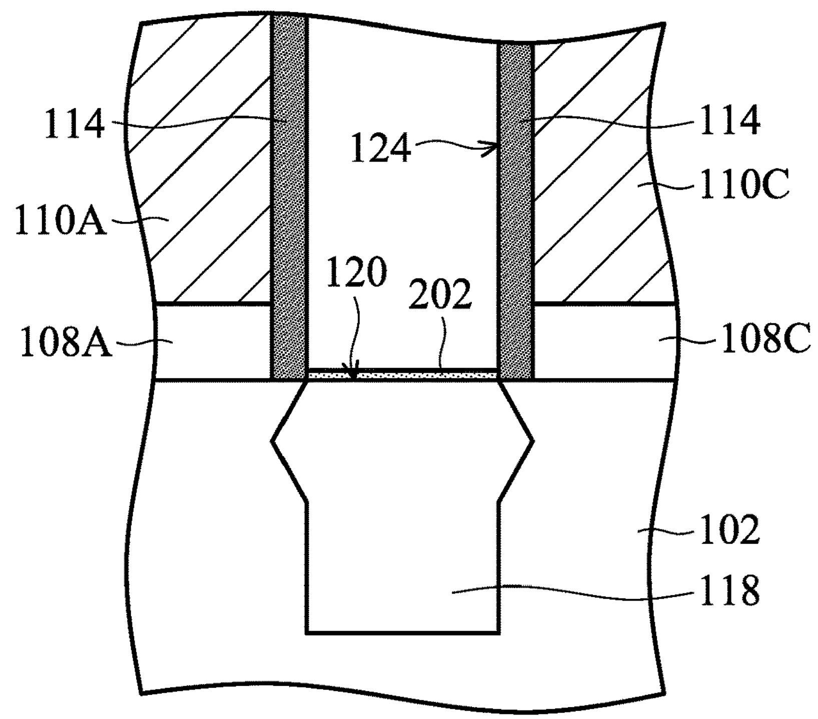
FIGS. 2A-2E are cross-sectional views of various stages of a process for forming an etch stop layer, in accordance with some embodiments.

In some embodiments, the etch stop layer 122 is made of silicon nitride. FIG. 2A is a partially enlarged view of the source/drain portion 118. As shown in FIG. 2A, in the atomic layer deposition process, a first nitride layer 202 is deposited over the top surface 120 of the source/drain portion 118 by performing a first nitridation process, in accordance with some embodiments.

In some embodiments, before the first nitridation process is performed, an etching process is performed to remove the native oxide over the top surface 120 of the source/drain portion 118. However, embodiments of the disclosure are not limited thereto. In some other embodiments, this etching process is not performed.

In some embodiments, in the first nitridation process, the first nitride layer 202 is grown from or deposited over the top surface 120 of the source/drain portion 118. In some embodiments, in the first nitridation process, the first nitride layer 202 is not grown from or deposited over the side surface 124 of the spacer elements 114. Therefore, as shown in FIG. 2A, the first nitride layer 202 exposes the spacer elements 114, in accordance with some embodiments.

In some embodiments, the first nitridation process applies an ammonia plasma or a nitrogen plasma to the structure shown in FIG. 1D to form the first nitride layer 202 over the top surface 120 of the source/drain portion 118. In some embodiments, the first nitridation process applies the ammonia plasma or the nitrogen plasma onto the top surface 120 of the source/drain portion 118. In some embodiments, the power of the ammonia plasma or the nitrogen plasma is in a range from about 100 W to about 3000 W, for example, from about 500 W to about 1000 W.

The term "about" typically means +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about".

In some embodiments, the exposed top surface 120 of the source/drain portion 118 in FIG. 1D has a first crystallinity, and the side surface 124 of the spacer elements 114 in FIG. 1D has a second crystallinity. In some embodiments, the first crystallinity is greater than the second crystallinity. In some embodiments, the exposed top surface 120 of the source/drain portion 118 in FIG. 1D has a crystalline structure, whereas the side surface 124 of the spacer elements 114 in FIG. 1D has an amorphous structure. In some embodiments, the exposed top surface 120 of the source/drain portion 118 in FIG. 1D has a single crystalline structure.

In some embodiments, since the first crystallinity of the exposed top surface 120 of the source/drain portion 118 is greater than the second crystallinity of the exposed side surface 124 of the spacer elements 114, the nitridation of the exposed top surface 120 of the source/drain portion 118 is easier to start than the nitridation of the exposed side surface 124 of the spacer elements 114. Therefore, in some embodiments, after starting the first nitridation process from a first nitridation start time-point, the nitridation of the top surface 120 of the source/drain portion 118 starts at a first time-point from the first nitridation start time-point. In some embodiments, the nitridation of the spacer elements 114 starts at a second time-point from the first nitridation start time-point. In some embodiments, the second time-point is greater than the first time-point.

In some embodiments, the time duration from the first nitridation start time-point to the first time-point is the time required to start the nitridation of the top surface 120 of the source/drain portion 118. In some embodiments, the time duration from the first nitridation start time-point to the second time-point is the time required to start the nitridation of the side surface 124 of the spacer elements 114. In some embodiments, the time duration from the first nitridation start time-point to the second time-point is greater than the time duration from the first nitridation start time-point to the first time-point. In some embodiments, the time required to start the nitridation of the side surface 124 of the spacer elements 114 is longer than the time required to start the nitridation of the top surface 120 of the source/drain portion 118.

In some embodiments, when the first nitridation start time-point is set at zero seconds, the first time-point is in a range from about 40 seconds to about 600 seconds, for example from about 70 seconds to about 400 seconds, for example from about 100 seconds to about 200 seconds. In some embodiments, the time duration from the first nitridation start time-point to the first time-point is the time required to start the nitridation of the top surface 120 of the source/drain portion 118. In some embodiments, the time duration from the first nitridation start time-point to the first time-point is in a range from about 40 seconds to about 600 seconds, for example from about 70 seconds to about 400 seconds, for example from about 100 seconds to about 200 seconds.

In some embodiments, when the first nitridation start time-point is set at zero seconds, the second time-point is in a range from about 70 seconds to about 700 seconds, for example from about 100 seconds to about 500 seconds, for example from about 200 seconds to about 300 seconds. In some embodiments, the time duration from the first nitridation start time-point to the second time-point is the time required to start the nitridation of the side surface 124 of the spacer elements 114. In some embodiments, the time duration from the first nitridation start time-point to the second time-point is in a range from about 70 seconds to about 700 seconds, for example from about 100 seconds to about 500 seconds, for example from about 200 seconds to about 300 seconds.

In some embodiments, the first nitridation process is performed from the first nitridation start time-point to a first nitridation end time-point, and the first nitridation end time-point is between the first time-point and the second time-point.

In some embodiments, when the first nitridation start time-point is set at zero seconds, the first nitridation end time-point is in a range from about 50 seconds to about 600 seconds, for example from about 100 seconds to about 500 seconds, for example from about 200 seconds to about 400 seconds, for example from about 250 seconds to about 300 seconds. In some embodiments, the time duration from the first nitridation start time-point to the first nitridation end time-point is referred to as the process time of the first nitridation process. In some embodiments, the time duration from the first nitridation start time-point to the first nitridation end time-point is in a range from about 50 seconds to about 600 seconds, for example from about 100 seconds to about 500 seconds, for example from about 200 seconds to about 400 seconds, for example from about 250 seconds to about 300 seconds.

In some embodiments, since the first nitridation end time-point of the first nitridation process is after the first time-point and before the second time-point, when the first nitridation process stopped at the first nitridation end time-point, the nitridation of the top surface 120 of the source/drain portion 118 has already started, whereas the nitridation of the spacer elements 114 has not started yet. Therefore, in some embodiments, in the first nitridation process, the first nitride layer 202 is grown from or deposited over the top surface 120 of the source/drain portion 118, but is not grown from or deposited over the side surface 124 of the spacer elements 114.

In some embodiments, the first nitride layer 202 is a monatomic layer. In some embodiments, one (or more) of the nitrogen atoms in the first nitride layer 202 is bonded to the silicon atom in the source/drain portion 118 and/or another one (or more than one) nitrogen atom in the first nitride layer 202. In some embodiments, the thickness of the first nitride layer 202 is in a range from about 5 angstrom to about 20 angstrom, for example from about 10 angstrom to about 15 angstrom.

Figure 2B:
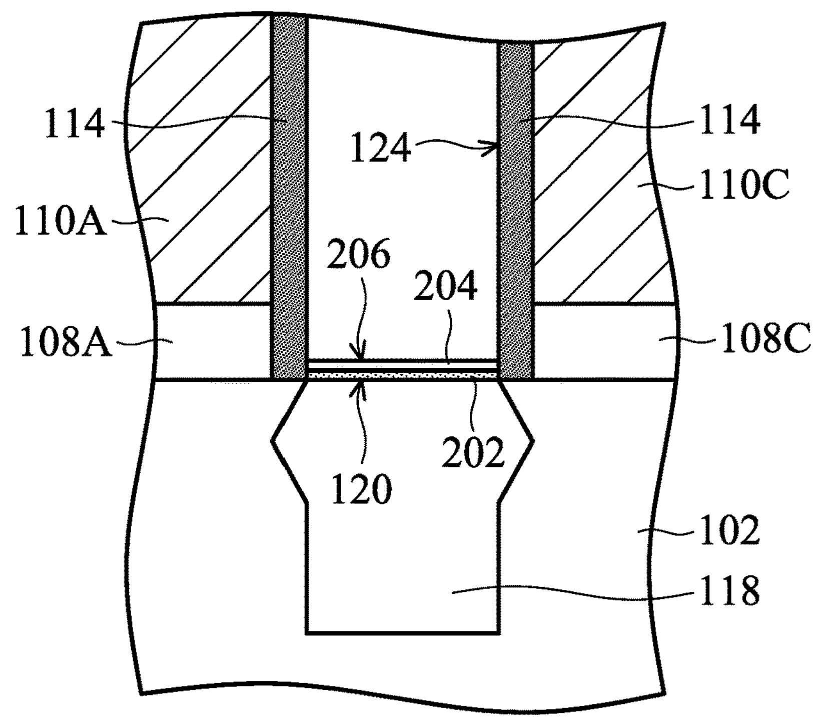

Afterwards, as shown in FIG. 2B, the atomic layer deposition process further includes performing a first silicon deposition process to deposit a first silicon layer 204 over the first nitride layer 202, in accordance with some embodiments. As shown in FIG. 2B, the first silicon layer 204 has a top surface 206, in accordance with some embodiments.

In some embodiments, a silicon-containing precursor is applied to the first nitride layer 202 to form the first silicon layer 204 over the first nitride layer 202. In some embodiments, the silicon-containing precursor includes, but is not limited to, dichlorosilane (DCS), monochlorosilane (MCS), trichlorosilane (TCS), tetrachlorosilane ($SiCl_4$), and hexachlorodisilane (HCDS), silane ($SiH_4$), another suitable material, or a combination thereof. In some embodiments, the silicon-containing precursor is in a gaseous state.

In some embodiments, in the first silicon deposition process, the silicon atom of the silicon-containing precursor is bonded to the nitrogen atom in the first nitride layer 202 to form the first silicon layer 204 over the first nitride layer 202. Therefore, in some embodiments, in the first silicon deposition process, the first silicon layer 204 is grown from or deposited over the first nitride layer 202, but is not grown from or deposited over the side surface 124 of the spacer elements 114.

In some embodiments, the first silicon layer 204 is a monatomic layer. In some embodiments, the thickness of the first silicon layer 204 is in a range from about 5 angstrom to about 20 angstrom, for example from about 10 angstrom to about 15 angstrom.

Figure 2C:
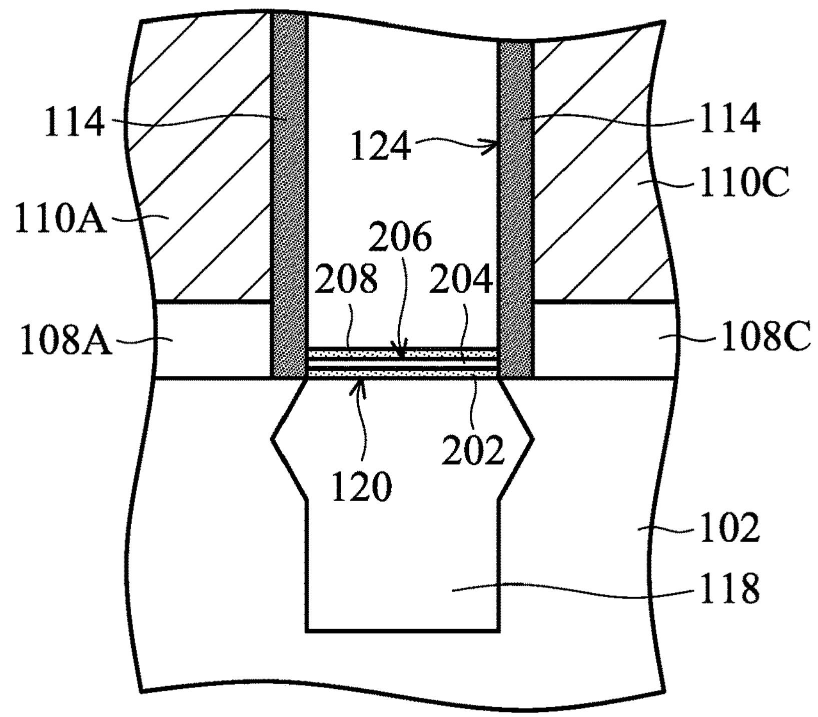

Afterwards, as shown in FIG. 2C, in the atomic layer deposition process, a second nitride layer 208 is deposited over the top surface 206 of the first silicon layer 204 by performing a second nitridation process, in accordance with some embodiments.

In some embodiments, in the second nitridation process, the second nitride layer 208 is grown from or deposited over the top surface 206 of the first silicon layer 204. In some embodiments, in the second nitridation process, the second nitride layer 208 is not grown from or deposited over the side surface 124 of the spacer elements 114. Therefore, as shown in FIG. 2C, the second nitride layer 208 exposes the spacer elements 114, in accordance with some embodiments.

In some embodiments, the second nitridation process applies an ammonia plasma or a nitrogen plasma to the structure shown in FIG. 2B to form the second nitride layer 208 over the top surface 206 of the first silicon layer 204. In some embodiments, the second nitridation process applies the ammonia plasma or the nitrogen plasma onto the top surface 206 of the first silicon layer 204. In some embodiments, the power of the ammonia plasma or the nitrogen plasma is in a range from about 100 W to about 3000 W, for example, from about 500 W to about 1000 W.

In some embodiments, the exposed top surface 206 of the first silicon layer 204 in FIG. 2B has a third crystallinity, and the side surface 124 of the spacer elements 114 in FIG. 2B has the second crystallinity. In some embodiments, the third crystallinity is greater than the second crystallinity. In some embodiments, the exposed top surface 206 of the first silicon layer 204 in FIG. 2B has a crystalline structure, whereas the side surface 124 of the spacer elements 114 in FIG. 2B has an amorphous structure. In some embodiments, the exposed top surface 206 of the first silicon layer 204 in FIG. 2B has a single crystalline structure.

In some embodiments, since the third crystallinity of the exposed top surface 206 of the first silicon layer 204 is greater than the second crystallinity of the exposed side surface 124 of the spacer elements 114, the nitridation of the exposed top surface 206 of the first silicon layer 204 is easier to start than the nitridation of the exposed side surface 124 of the spacer elements 114. Therefore, in some embodiments, after starting the second nitridation process from a second nitridation start time-point, the nitridation of the top surface 206 of the first silicon layer 204 starts at a third time-point from the second nitridation start time-point. In some embodiments, the nitridation of the spacer elements 114 starts at a second time-point from the second nitridation start time-point. In some embodiments, the second time-point is greater than the third time-point.

In some embodiments, the time duration from the second nitridation start time-point to the third time-point is the time required to start the nitridation of the top surface 206 of the first silicon layer 204. In some embodiments, the time duration from the second nitridation start time-point to the second time-point is the time required to start the nitridation of the side surface 124 of the spacer elements 114. In some embodiments, the time duration from the second nitridation start time-point to the second time-point is greater than the time duration from the second nitridation start time-point to the third time-point. In some embodiments, the time required to start the nitridation of the side surface 124 of the spacer elements 114 is longer than the time required to start the nitridation of the top surface 206 of the first silicon layer 204.

In some embodiments, when the second nitridation start time-point is set at zero seconds, the third time-point is in a range from about 40 seconds to about 600 seconds, for example from about 70 seconds to about 400 seconds, for example from about 100 seconds to about 200 seconds. In some embodiments, the time duration from the second nitridation start time-point to the third time-point is the time required to start the nitridation of the top surface 206 of the first silicon layer 204. In some embodiments, the time duration from the second nitridation start time-point to the third time-point is in a range from about 40 seconds to about 600 seconds, for example from about 70 seconds to about 400 seconds, for example from about 100 seconds to about 200 seconds.

In some embodiments, when the second nitridation start time-point is set at zero seconds, the second time-point is in a range from about 70 seconds to about 700 seconds, for example from about 100 seconds to about 500 seconds, for example from about 200 seconds to about 300 seconds. In some embodiments, the time duration from the second nitridation start time-point to the second time-point is the time required to start the nitridation of the side surface 124 of the spacer elements 114. In some embodiments, the time duration from the second nitridation start time-point to the second time-point is in a range from about 70 seconds to about 700 seconds, for example from about 100 seconds to about 500 seconds, for example from about 200 seconds to about 300 seconds.

In some embodiments, the second nitridation process is performed from the second nitridation start time-point to a second nitridation end time-point, and the second nitridation end time-point is between the third time-point and the second time-point.

In some embodiments, when the second nitridation start time-point is set at zero seconds, the second nitridation end time-point is in a range from about 50 seconds to about 600 seconds, for example from about 100 seconds to about 500 seconds, for example from about 200 seconds to about 400 seconds, for example from about 250 seconds to about 300 seconds. In some embodiments, the time duration from the second nitridation start time-point to the second nitridation end time-point is referred to as the process time of the second nitridation process. In some embodiments, the time duration from the second nitridation start time-point to the second nitridation end time-point is in a range from about 50 seconds to about 600 seconds, for example from about 100 seconds to about 500 seconds, for example from about 200 seconds to about 400 seconds, for example from about 250 seconds to about 300 seconds.

In some embodiments, since the second nitridation end time-point of the second nitridation process is after the third time-point and before the second time-point, when the second nitridation process stopped at the second nitridation end time-point, the nitridation of the top surface 206 of the first silicon layer 204 has already started, whereas the nitridation of the spacer elements 114 has not started yet. Therefore, in some embodiments, in the second nitridation process, the second nitride layer 208 is grown from or deposited over the top surface 206 of the first silicon layer 204, but is not grown from or deposited over the side surface 124 of the spacer elements 114.

In some embodiments, the second nitride layer 208 is a monatomic layer. In some embodiments, one (or more) of the nitrogen atoms in the second nitride layer 208 is bonded to the silicon atom in the first silicon layer 204 and/or another one (or more than one) nitrogen atom in the second nitride layer 208. In some embodiments, the thickness of the second nitride layer 208 is in a range from about 5 angstrom to about 20 angstrom, for example from about 10 angstrom to about 15 angstrom.

Figure 2D:
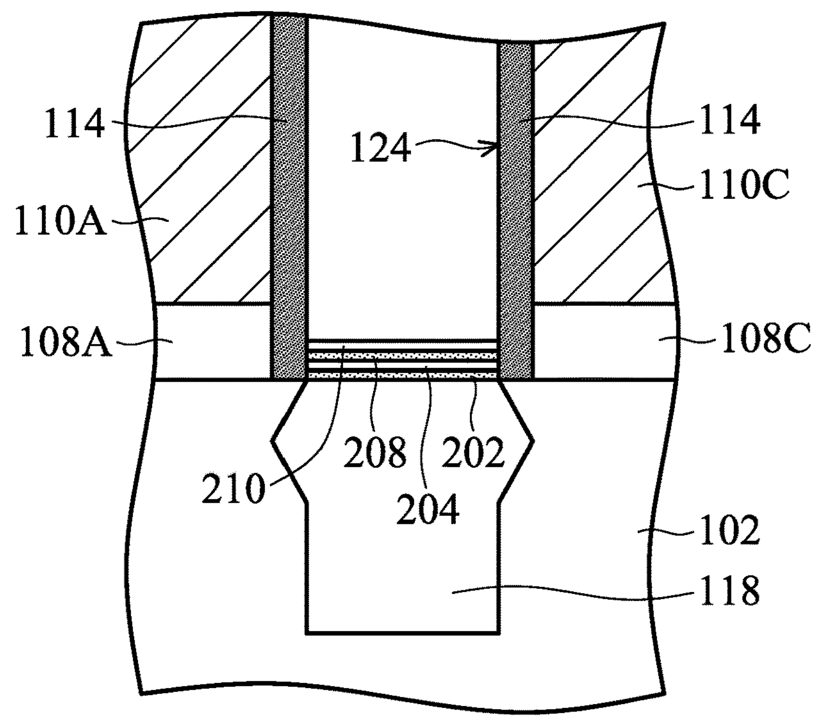

Afterwards, as shown in FIG. 2D, the atomic layer deposition process further includes performing a second silicon deposition process to deposit a second silicon layer 210 over the second nitride layer 208, in accordance with some embodiments.

In some embodiments, a silicon-containing precursor is applied to the second nitride layer 208 to form the second silicon layer 210 over the second nitride layer 208. In some embodiments, the silicon-containing precursor includes, but is not limited to, dichlorosilane (DCS), monochlorosilane (MCS), trichlorosilane (TCS), tetrachlorosilane ($SiCl_4$), and hexachlorodisilane (HCDS), silane ($SiH_4$), another suitable material, or a combination thereof. In some embodiments, the silicon-containing precursor is in a gaseous state.

In some embodiments, in the second silicon deposition process, the silicon atom of the silicon-containing precursor is bonded to the nitrogen atom in the second nitride layer 208 to form the second silicon layer 210 over the second nitride layer 208. Therefore, in some embodiments, in the second silicon deposition process, the second silicon layer 210 is grown from or deposited over the second nitride layer 208, but is not grown from or deposited over the side surface 124 of the spacer elements 114.

In some embodiments, the second silicon layer 210 is a monatomic layer. In some embodiments, the thickness of the second silicon layer 210 is in a range from about 5 angstrom to about 20 angstrom, for example from about 10 angstrom to about 15 angstrom.

Figure 2E:
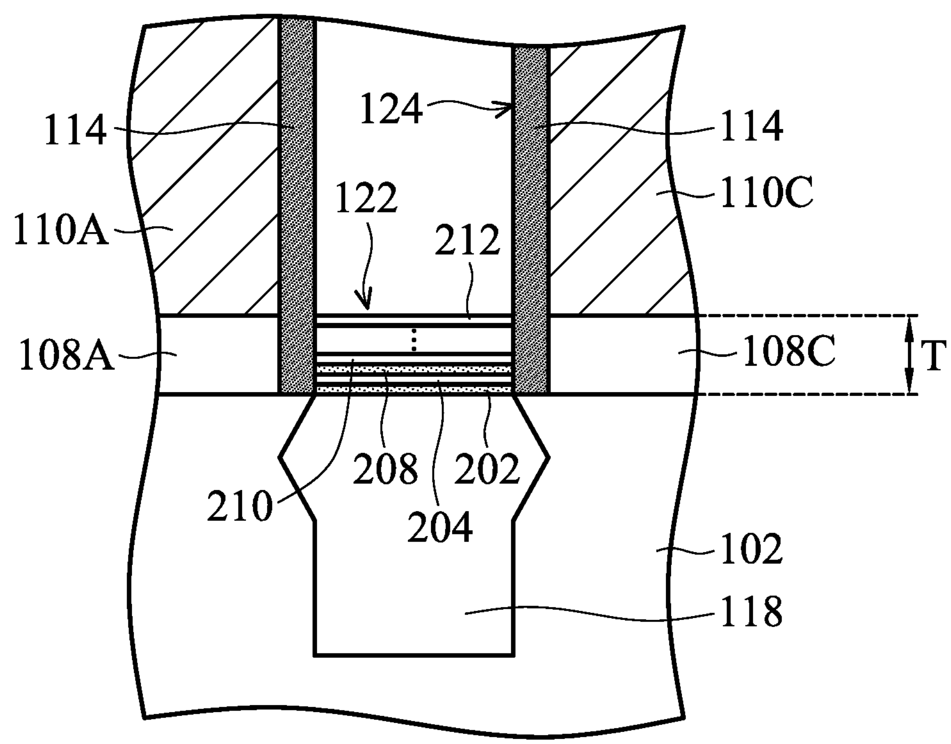

Afterwards, as shown in FIG. 2E, the second nitridation process and the second silicon deposition process are alternatively performed to alternatively deposit the nitride layers and silicon layers over the second silicon layer 210 to form the silicon nitride etch stop layer 122, in accordance with some embodiments.

In some embodiments, by the atomic layer deposition process shown in FIGS. 2A-2E, the etch stop layer 122 is grown from or deposited over the top surface 120 of the source/drain portion 118, but is not grown from or deposited over the side surface 124 of the spacer elements 114. Therefore, as shown in FIGS. 1E and 2E, the etch stop layer 122 covers and contacts the lower portion of the spacer elements 114, and exposes the upper portion of the spacer elements 114, in accordance with some embodiments.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the semiconductor device structure to be constructed or operated in a particular orientation.

As shown in FIG. 2E, the layer 212 is the top-most layer of the silicon nitride etch stop layer 122, in accordance with some embodiments. In some embodiments, the layer 212 is a nitride layer. In some other embodiments, the layer 212 is a silicon layer.

In some embodiments, the etch stop layer 122 may have any number of alternatively deposited nitride layers and silicon layers. In some embodiments, the etch stop layer 122 includes two layers, i.e. the first nitride layer 202 and the first silicon layer 204. In some other embodiments, the etch stop layer 122 includes four layers, i.e. the first nitride layer 202, the first silicon layer 204, the second nitride layer 208 and the second silicon layer 210. However, embodiments of the disclosure are not limited thereto. In some other embodiments, the etch stop layer 122 may have any number of alternatively deposited nitride layers and silicon layers. In some embodiments, the total number of alternatively deposited nitride layers and silicon layers of the etch stop layer 122 is in a range from 2 to 100, for example from 10 to 20.

In addition, embodiments of the disclosure are not limited thereto. In some other embodiments, the etch stop layer 122 is made of another suitable material such as silicon oxide or silicon oxynitride. In some embodiments, these etch stop layers 122 having material other than silicon nitride are deposited over the top surface 120 of the source/drain portion 118 by the atomic layer deposition process similar to that shown in FIGS. 2A-2E. Therefore, in some embodiments, the etch stop layer 122 having material other than silicon nitride is grown from or deposited over the top surface 120 of the source/drain portion 118, but is not grown from or deposited over the side surface 124 of the spacer elements 114.

As shown in FIG. 2E, the etch stop layer 122 has a thickness T in a range from about 1 nm to about 100 nm, for example, from about 5 nm to about 10 nm, in accordance with some embodiments. Referring back to FIG. 1E, the top surface of the etch stop layer 122 and the side surface 124 of the upper portion of the spacer elements 114 exposed by the etch stop layer 122 together form the opening 125, in accordance with some embodiments.

Figure 1F:
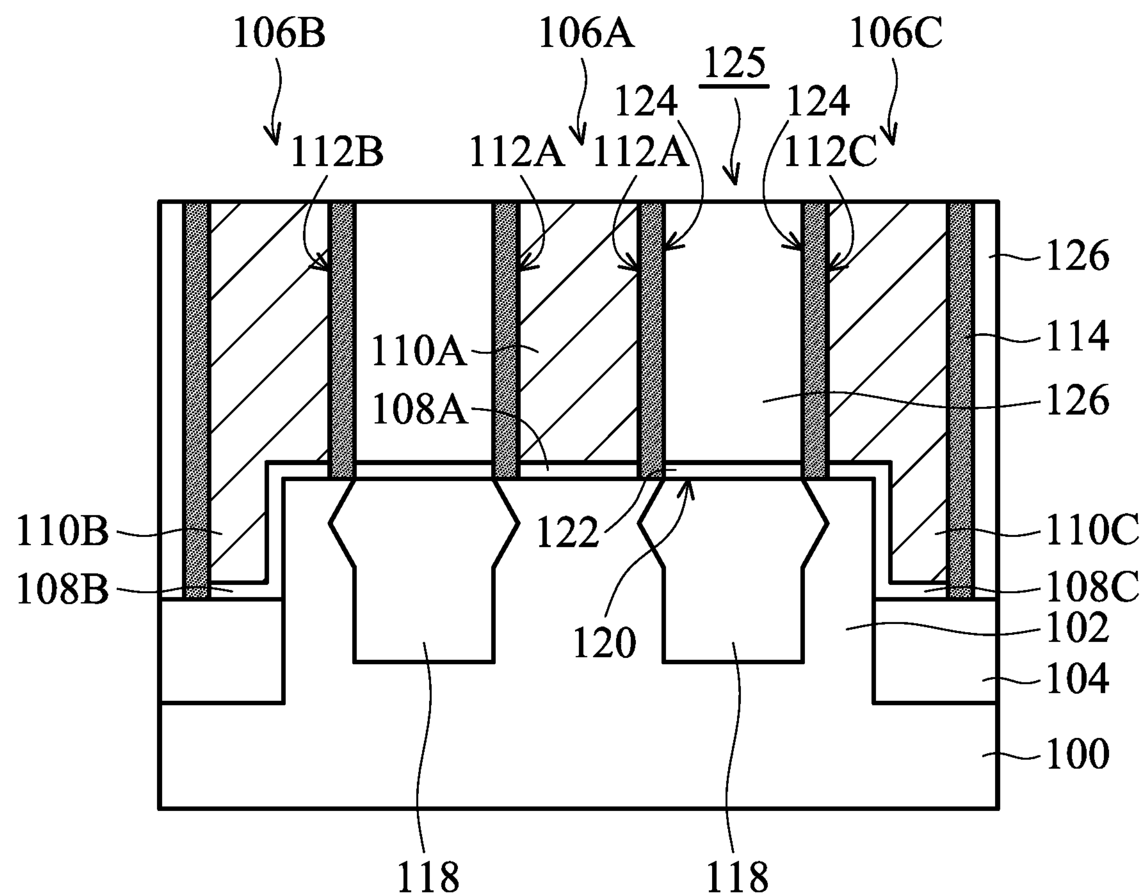

Afterwards, as shown in FIG. 1F, an interlayer dielectric layer 126 is subsequently formed in the opening 125 to surround the spacer elements 114, the first gate structure 106A, the second gate structure 106B and the third gate structure 106C, in accordance with some embodiments. As shown in FIG. 1F, the interlayer dielectric layer 126 covers the source/drain portions 118 and the etch stop layer 122, in accordance with some embodiments. As shown in FIG. 1F, the interlayer dielectric layer 126 contacts the upper portion of the spacer elements 114, while the etch stop layer 122 contacts a lower portion of the spacer elements 114, in accordance with some embodiments.

In some embodiments, a dielectric material layer is deposited to cover the spacer elements 114, the etch stop layer 122, and the first gate structure 106A, the second gate structure 106B and the third gate structure 106C. In some embodiments, the dielectric material layer is made of silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric material layer is deposited using a CVD process, an ALD process, a spin-on process, a spray coating process, another applicable process, or a combination thereof.

Afterwards, a planarization process may be used to thin down and partially remove the dielectric material layer. The dielectric material layer may be partially removed until the first gate structure 106A, the second gate structure 106B and the third gate structure 106C are exposed. As a result, the interlayer dielectric layer 126 is formed. In some embodiments, the planarization process includes a CMP process, a grinding process, a dry polishing process, an etching process, another applicable process, or a combination thereof.

However, embodiments of the disclosure are not limited thereto. In some other embodiments, the interlayer dielectric layer 126 is formed in the opening 125 by a flowable chemical vapor deposition (FCVD). In some embodiments, in the flowable chemical vapor deposition, the interlayer dielectric layer 126 is cured by steam annealing. In some embodiments, since the etch stop layer 122 does not cover the upper portion of the spacer elements 114 as shown in FIG. 1E, the opening 125 has a wider width compared to the structure with the etch stop layer covering the upper portion of the spacer elements. In some embodiments, the wider width of the opening 125 increases the efficiency of the steam annealing for curing the interlayer dielectric layer 126. Therefore, the quality of the interlayer dielectric layer 126 may be improved.

In addition, in some cases, the etch stop layer is grown from or deposited over both the top surface of the source/drain portion and the side surface of the spacer elements. In some cases, the upper portion and the lower portion of the spacer elements are covered by the etch stop layer. Therefore, the thicker the portion of the etch stop layer covering the top surface of the source/drain portion, the thicker the portion of the etch stop layer covering the upper portion of the spacer elements. In some cases, the thickness of the etch stop layer over the upper portion of the spacer elements cannot be too thick in order to leave sufficient space or opening for the formation of the interlayer dielectric layer and the subsequently formed contact plug. In these cases, since the thickness of the portion of the etch stop layer over the upper portion of the spacer elements is limited, the thickness of the portion of the etch stop layer over the top surface of the source/drain portion is also limited. Therefore, in some cases, if the portion of the etch stop layer over the top surface of the source/drain portion has a limited and insufficient thickness, the etch stop layer cannot prevent the source/drain portion from being oxidized in the process of forming the interlayer dielectric layer. If the source/drain portion is oxidized, the electrical resistance of the source/drain portion would increase, and the quality of the semiconductor device structure would decrease.

In some embodiments, since the etch stop layer 122 is grown from or deposited over the top surface 120 of the source/drain portion 118, but is not grown from or deposited over the side surface 124 of the spacer elements 114, some embodiments of the present disclosure may form the etch stop layer 122 with any designed thickness. Therefore, the etch stop layer 122 in some embodiments has a sufficient thickness to prevent the source/drain portion 118 from being oxidized in the process of forming the interlayer dielectric layer 126. Therefore, in some embodiments, the quality of the semiconductor device structure would increase.

Figure 1G:
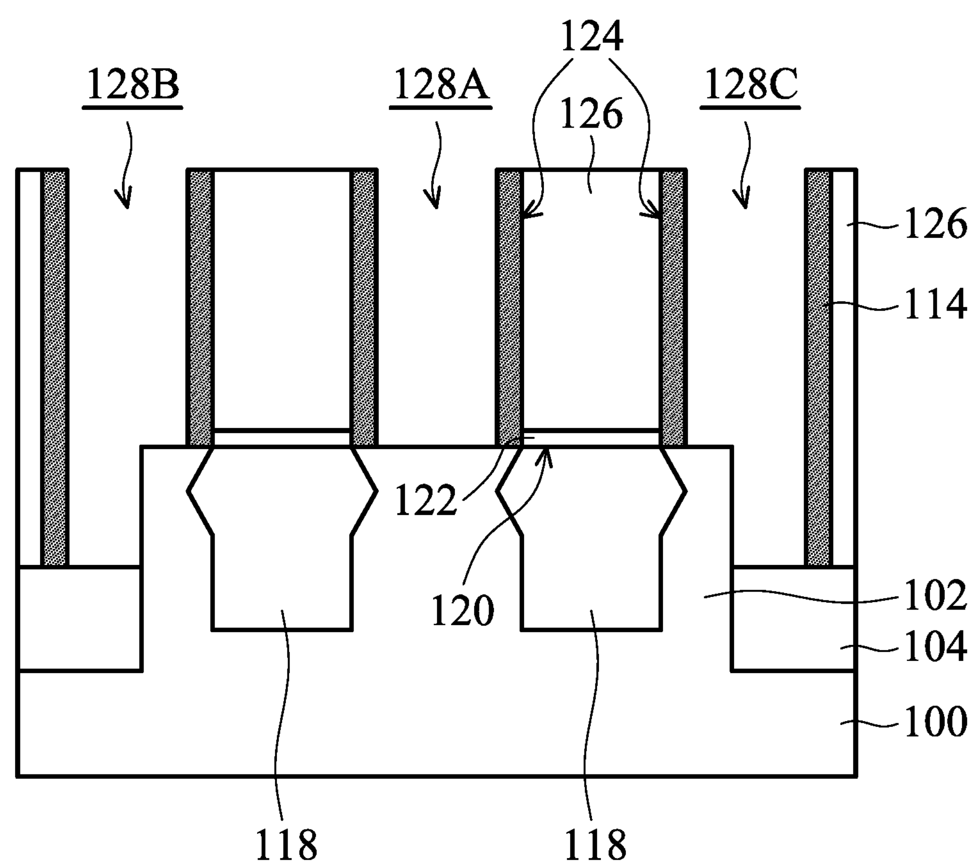
Figure 1H:
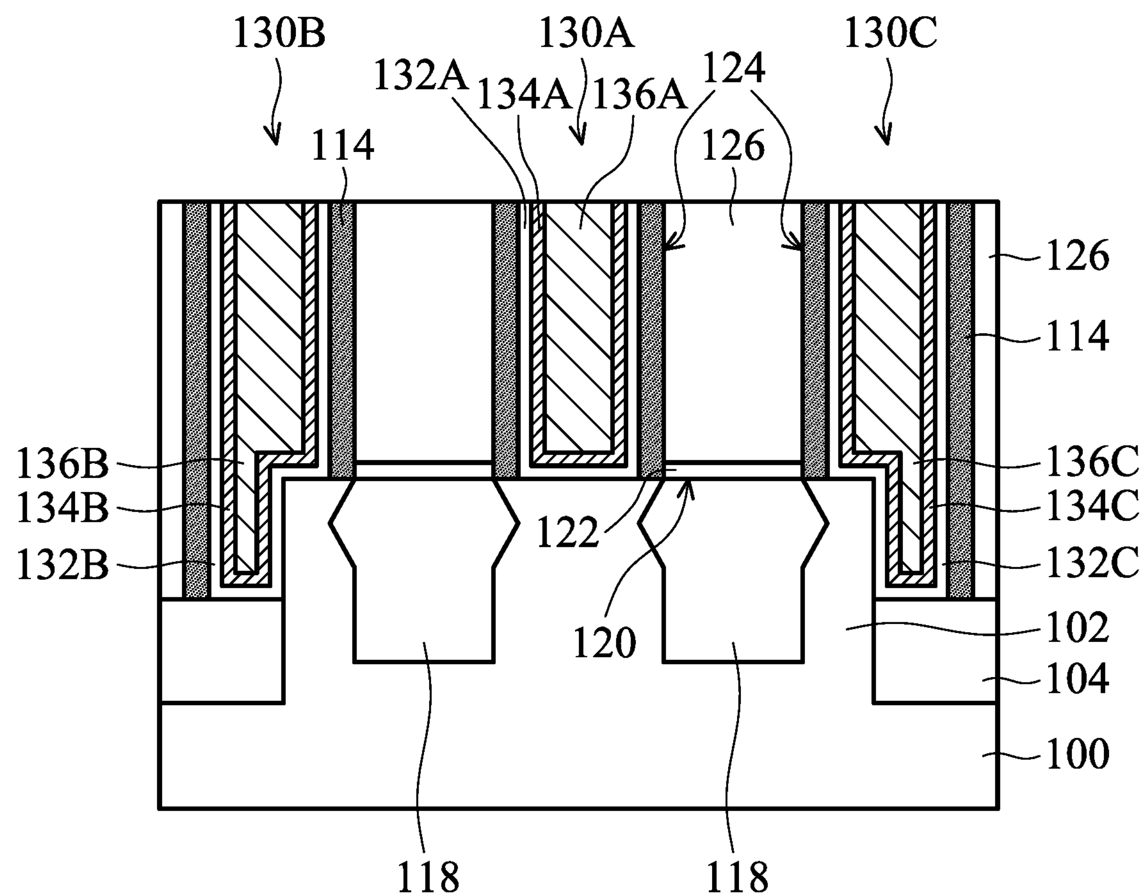

As shown in FIGS. 1G and 1H, one or more gate replacement processes are subsequently performed to replace the first gate structure 106A, the second gate structure 106B and the third gate structure 106C with other gate structures, in accordance with some embodiments. In some embodiments, the gate replacement process is a metal gate replacement process and the first gate structure 106A, the second gate structure 106B and the third gate structure 106C are replaced with suitable metal materials. However, embodiments of the disclosure are not limited thereto. In some other embodiments, one or more of the first gate structure 106A, the second gate structure 106B and the third gate structure 106C are not replaced.

As shown in FIG. 1G, after the formation of the interlayer dielectric layer 126, the first gate structure 106A, the second gate structure 106B and the third gate structure 106C are removed to form recesses 128A, 128B and 128C, as shown in FIG. 1G in accordance with some embodiments. The recesses 128A, 128B and 128C expose the fin structure 102. One or more etching processes may be used to form the recesses 128A, 128B and 128C.

In some embodiments, the first gate structure 106A, the second gate structure 106B and the third gate structure 106C are removed using a wet etching process. For example, an etching solution containing $NH_4OH$ solution, dilute-HF, other suitable etching solution, or a combination thereof may be used. In some embodiments, the first gate structure 106A, the second gate structure 106B and the third gate structure 106C are removed using a dry etching process. Example etchants includes fluorine and/or chlorine based etchants.

As shown in FIG. 1H, a fourth gate structure 130A, a fifth gate structure 130B and a sixth gate structure 130C are respectively formed in the recesses 128A, 128B and 128C, in accordance with some embodiments. In some embodiments, the fourth gate structure 130A, the fifth gate structure 130B and the sixth gate structure 130C are metal gate structures. In some embodiments, the spacer elements 114 are positioned over the sidewalk of the fourth gate structure 130A, the fifth gate structure 130B and the sixth gate structure 130C.

As shown in FIG. 1H, the fourth gate structure 130A is formed over the top surface of the fin structure 102, in accordance with some embodiments. As shown in FIG. 1H, the fourth gate structure 130A includes a fourth gate dielectric layer 132A, a fourth work function layer 134A, and a fourth conductive filling layer 136A, in accordance with some embodiments. As shown in FIG. 1H, the fourth gate dielectric layer 132A is over the top surface of the fin structure 102 of the semiconductor substrate 100, the fourth work function layer 134A is conformally deposited over the fourth gate dielectric layer 132A, and the fourth conductive filling layer 136A is deposited over the fourth work function layer 134A, in accordance with some embodiments.

As shown in FIG. 1H, the fifth gate structure 130B and sixth gate structure 130C are positioned at opposite ends of the fin structure 102, in accordance with some embodiments. As shown in FIG. 1H, the fourth gate structure 130A is positioned between the fifth gate structure 130B and sixth gate structure 130C, in accordance with some embodiments.

As shown in FIG. 1H, the fifth gate structure 130B is formed over a portion of the top surface of the fin structure 102, over the side surface of the fin structure 102 at one end of the fin structure 102, and over the isolation structure 104, in accordance with some embodiments. As shown in FIG. 1H, the sixth gate structure 130C is formed over a portion of the top surface of the fin structure 102, over the side surface of the fin structure 102 at the other end of the fin structure 102, and over the isolation structure 104, in accordance with some embodiments.

As shown in FIG. 1H, the fifth gate structure 130B includes a fifth gate dielectric layer 132B, a fifth work function layer 134B, and a fifth conductive filling layer 136B, in accordance with some embodiments. As shown in FIG. 1H, the fifth gate dielectric layer 132B is over a portion of the top surface of the fin structure 102, over the side surface of the fin structure 102 at one end of the fin structure 102, and over the isolation structure 104, in accordance with some embodiments. As shown in FIG. 1H, the fifth work function layer 134B is conformally deposited over the fifth gate dielectric layer 132B, and the fifth conductive filling layer 136B is deposited over the fifth work function layer 134B, in accordance with some embodiments.

As shown in FIG. 1H, the sixth gate structure 130C includes a sixth gate dielectric layer 132C, a sixth work function layer 134C, and a sixth conductive filling layer 136C, in accordance with some embodiments. As shown in FIG. 1H, the sixth gate dielectric layer 132C is over a portion of the top surface of the fin structure 102, over the side surface of the fin structure 102 at the other end of the fin structure 102, and over the isolation structure 104, in accordance with some embodiments. As shown in FIG. 1H, the sixth work function layer 134C is conformally deposited over the sixth gate dielectric layer 132C, and the sixth conductive filling layer 136C is deposited over the sixth work function layer 134C, in accordance with some embodiments.

In some embodiments, the materials of the fourth gate dielectric layer 132A, the fifth gate dielectric layer 132B and the sixth gate dielectric layer 132C are the same. In some embodiments, the fourth gate dielectric layer 132A, the fifth gate dielectric layer 132B and the sixth gate dielectric layer 132C are made of a high-k material. In some embodiments, the high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, (Ba,Sr)$TiO_3$ (BST), $Al_2O_3$, another suitable high-k dielectric material, or a combination thereof.

The fourth work function layer 134A, the fifth work function layer 134B and the sixth work function layer 134C are used to provide the desired work function for transistors to enhance device performance. In some embodiments, the fourth work function layer 134A, the fifth work function layer 134B and/or the sixth work function layer 134C are n-type metal layers capable of providing a work function value suitable for the device, such as equal to or less than about 4.5 eV. In some embodiments, the fourth work function layer 134A, the fifth work function layer 134B and/or the sixth work function layer 134C are p-type metal layers capable of providing a work function value suitable for the device, such as equal to or greater than about 4.8 eV.

In some embodiments, the fourth work function layer 134A, the fifth work function layer 134B and the sixth work function layer 134C are metal layers with same type, such as the n-type metal layer. In some other embodiments, one or more of the fourth work function layer 134A, the fifth work function layer 134B and the sixth work function layer 134C are metal layers with a type different from that of the others of the fourth work function layer 134A, the fifth work function layer 134B and the sixth work function layer 134C.

The n-type metal layer may include metal, metal carbide, metal nitride, or a combination thereof. For example, the n-type metal layer includes titanium nitride, tantalum, tantalum nitride, other suitable materials, or a combination thereof. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The thickness and/or the compositions of the fourth work function layer 134A, the fifth work function layer 134B and the sixth work function layer 134C may be fine-tuned to adjust the work function level. For example, a titanium nitride layer may be used as a p-type metal layer or an n-type metal layer, depending on the thickness and/or the compositions of the titanium nitride layer.

In some embodiments, a barrier layer (not shown) is formed between the gate dielectric layer and the work function layer. The barrier layer may be made of titanium nitride, tantalum nitride, another suitable material, or a combination thereof. In some embodiments, a blocking layer (not shown) is formed over the work function layer before the formation of the fourth conductive filling layer 136A, the fifth conductive filling layer 136B and/or sixth conductive filling layer 136C. The blocking layer may be made of tantalum nitride, titanium nitride, another suitable material, or a combination thereof.

In some embodiments, the materials of the fourth conductive filling layer 136A, the fifth conductive filling layer 136B and/or sixth conductive filling layer 136C are the same. In some embodiments, the fourth conductive filling layer 136A, the fifth conductive filling layer 136B and/or sixth conductive filling layer 136C are made of copper, aluminum, gold, tungsten, molybdenum, titanium, tantalum, platinum, hafnium, another suitable material, or a combination thereof.

In some embodiments, multiple layers are deposited over the interlayer dielectric layer 126 to fill the recesses 128A, 128B and 128C. Specifically, in some embodiments, a gate dielectric material layer, a work function material layer and a conductive filling material layer are sequentially deposited over the interlayer dielectric layer 126 to fill the recesses 128A, 128B and 128C. Afterwards, a planarization process is performed to remove the portions of these layers outside of the recesses 128A, 128B and 128C. The remaining portions of these layers in the recesses 128A, 128B and 128C form the fourth gate structure 130A, the fifth gate structure 130B and the sixth gate structure 130C, respectively. The planarization process may include a chemical mechanical polishing (CMP) process, a grinding process, a dry polishing process, an etching process, another applicable process, or a combination thereof.

In some embodiments, the top surfaces of the fourth gate structure 130A, the fifth gate structure 130B and the sixth gate structure 130C are substantially coplanar with the top surface of the interlayer dielectric layer 126 after the planarization process.

Within the context of this specification, the word "substantially" means preferably at least 90%, more preferably 95%, even more preferably 98%, most preferably 99%.

Figure 1I:
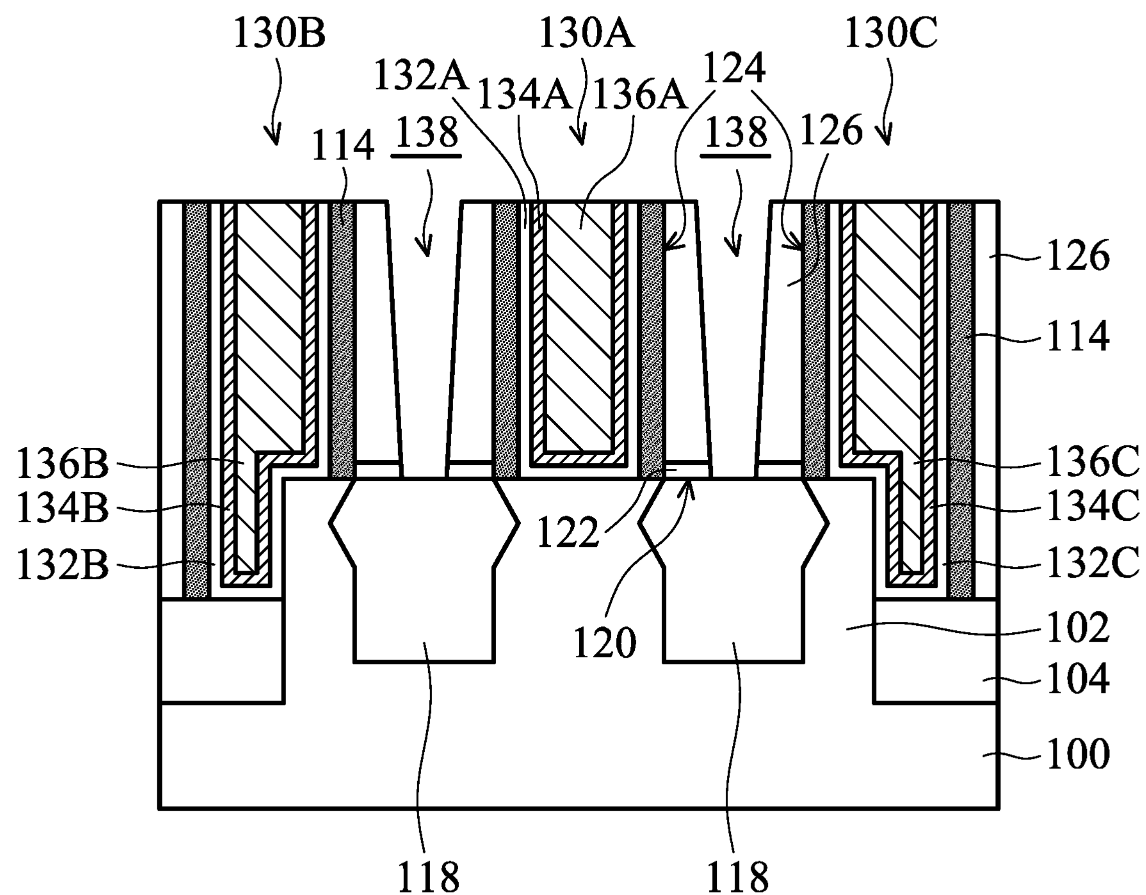

As shown in FIG. 1I, openings 138 are formed in the interlayer dielectric layer 126 to expose the source/drain portions 118, in accordance with some embodiments. In some embodiments, the formation of the openings 138 includes patterning the interlayer dielectric layer 126 by a photolithography process, etching the exposed surface of the interlayer dielectric layer 126 (for example, by using a dry etching process, a wet etching process, a plasma etching process, or a combination thereof) to form the openings 138.

As shown in FIG. 1I, the openings 138 penetrate through the interlayer dielectric layer 126 and the etch stop layer 122 to expose the source/drain portions 118, in accordance with some embodiments.

Figure 1J:
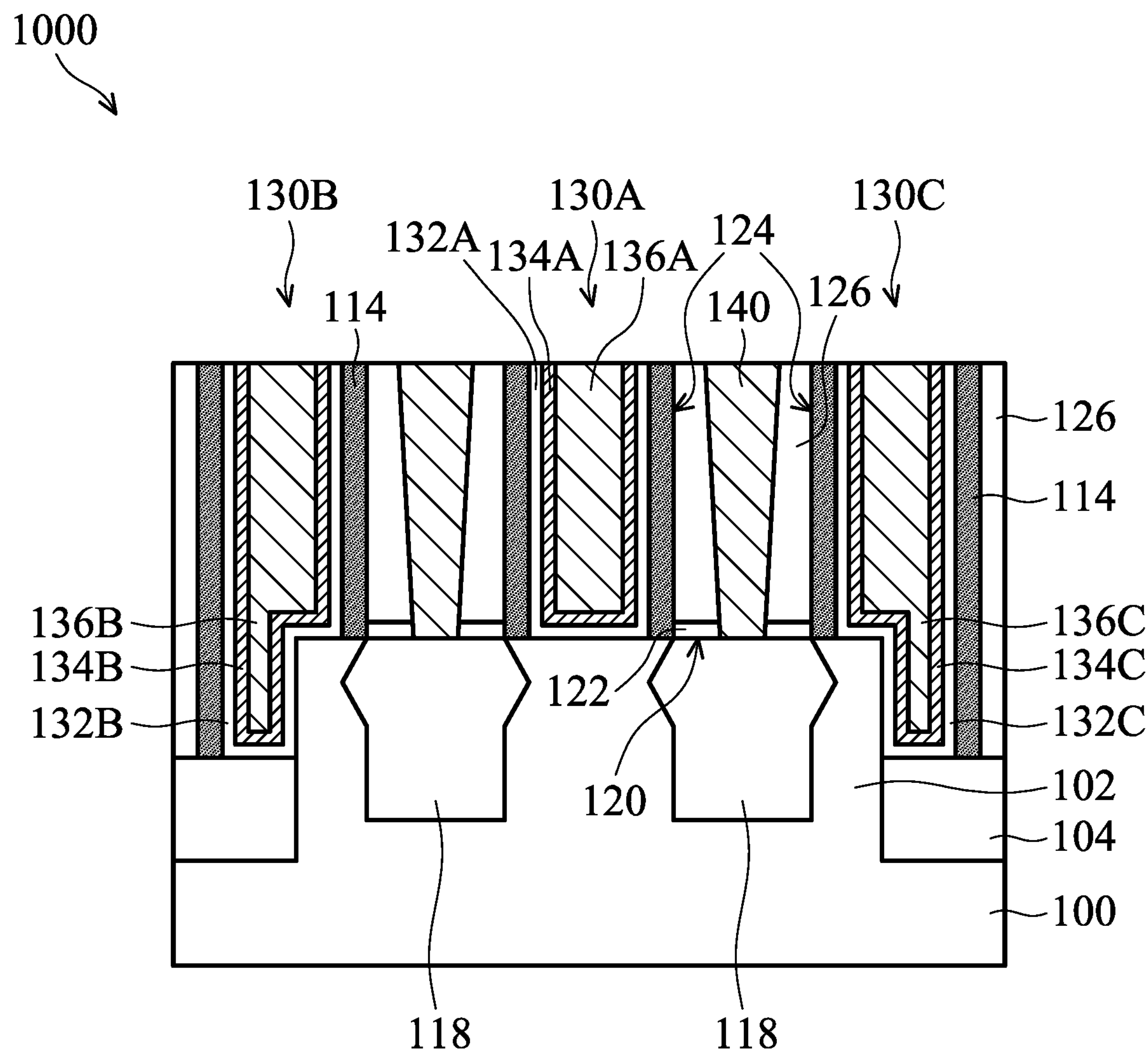

Afterwards, contact plugs 140 are formed in the interlayer dielectric layer 126 to form the semiconductor device structure 1000. As shown in FIG. 1J, the two contact plugs 140 are respectively electrically connected to the two source/drain portion 118 at opposite sides of the fourth gate structure 130A, in accordance with some embodiments. As shown in FIG. 1J, the contact plug 140 penetrates through the interlayer dielectric layer 126 and the etch stop layer 122, and electrically connected to the source/drain portion 118, in accordance with some embodiments. As shown in FIG. 1J, the contact plug 140 is in direct contact with the source/drain portion 118, in accordance with some embodiments.

As shown in FIG. 1J, the contact plug 140 is aligned with the source/drain portion 118. In some embodiments, each of the contact plugs 140 are made of a single layer or multiple layers of copper, aluminum, tungsten, gold, chromium, nickel, platinum, titanium, iridium, rhodium, an alloy thereof, a combination thereof, or another conductive material.

In some embodiments, a conductive material layer is deposited over the interlayer dielectric layer 126 and fills into the openings 138. In some embodiments, the conductive material layer is deposited by using chemical vapor deposition (CVD), sputtering, resistive thermal evaporation, electron beam evaporation, or another applicable method.

Afterwards, a planarization process may be used to partially remove the conductive material layer. The conductive material layer may be partially removed until the interlayer dielectric layer 126 is exposed. As a result, the conductive material layer that remains in the openings 138 forms the contact plugs 140. In some embodiments, the planarization process includes a CMP process, a grinding process, a dry polishing process, an etching process, another applicable process, or a combination thereof.

In some embodiments, since the etch stop layer 122 does not cover the side surface 124 of the upper portion of the spacer elements 114 as shown in FIGS. 1E and 1J, the opening 125 shown in FIG. 1E has wider width compared to the structure with the etch stop layer covering the upper portion of the spacer elements. In some embodiments, the opening 125 is the space in which the contact plug 140 is formed. Therefore, in some embodiments, there is more space for the formation of the contact plug 140 since the etch stop layer 122 does not cover the side surface 124 of the upper portion of the spacer elements 114. Therefore, there is a bigger process window for the formation of the contact plug 140. Therefore, in some embodiments, the manufacturing yield or the quality of the contact plug 140 may increase.

In addition, in some embodiments, since the etch stop layer 122 does not cover the side surface 124 of the upper portion of the spacer elements 114 as shown in FIGS. 1E and 1J, the dielectric constant between the contact plugs 140 and the gate structures including the fourth gate structure 130A, the fifth gate structure 130B and the sixth gate structure 130C is reduced. Therefore, the RC delay would be reduced. In some embodiments, the ring oscillator performance of the semiconductor device structure 1000 is improved. Therefore, in some embodiments, the performance of the semiconductor device structure 1000 is improved.

In addition, since the etch stop layer 122 in some embodiments has sufficient thickness, the etching capability for forming the openings 138 is also improved. In addition, the method of some embodiments of the present disclosure is easy to integrate.

Figure 3:
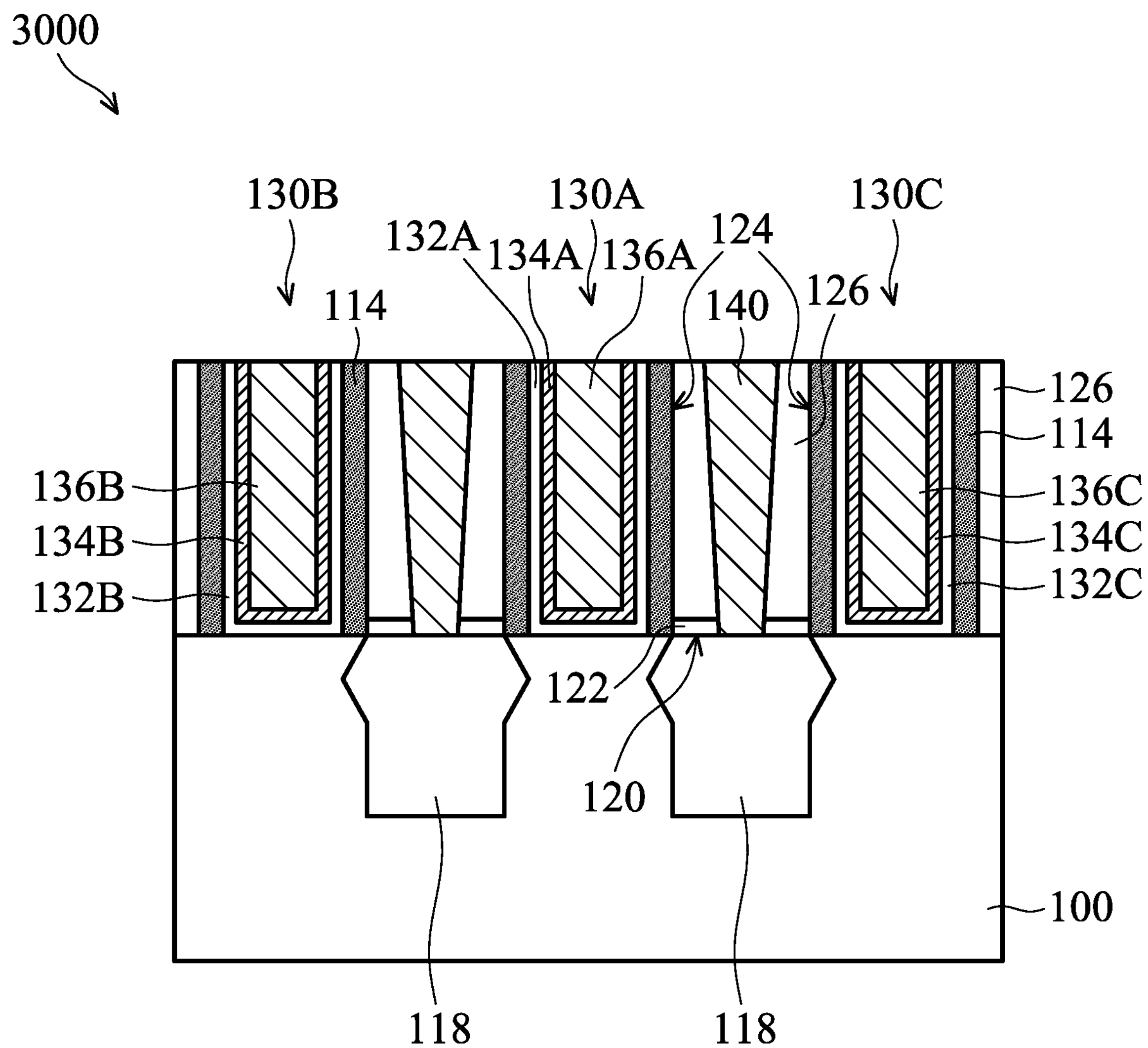
FIG. 3 is a cross-sectional view of a semiconductor device structure in accordance with some embodiments of the present disclosure.

It should be noted that the exemplary embodiment set forth in FIGS. 1A-1J is merely for the purpose of illustration. In addition to the embodiment set forth in FIGS. 1A-1J, the semiconductor device structure may have other configuration as shown in FIG. 3. This will be described in more detail in the following description. Therefore, the present disclosure is not limited to the exemplary embodiment shown in FIGS. 1A-1J.

FIG. 3 is a cross-sectional view of a semiconductor device structure 3000 in accordance with some other embodiments of the present disclosure. Note that the same or similar elements or layers corresponding to those of the semiconductor device are denoted by like reference numerals. In some embodiments, the same or similar elements or layers denoted by like reference numerals have the same meaning and will not be repeated for the sake of brevity.

As shown in FIG. 3, the spacer elements 114, the fourth gate structure 130A, the fifth gate structure 130B, the sixth gate structure 130C, the etch stop layer 122, the interlayer dielectric layer 126 and the contact plug 140 are not positioned over any fin structure of the semiconductor substrate 100, in accordance with some embodiments. As shown in FIG. 3, the spacer elements 114, the fourth gate structure 130A, the fifth gate structure 130B, the sixth gate structure 130C, the etch stop layer 122, the interlayer dielectric layer 126 and the contact plug 140 are positioned over a planar region of the semiconductor substrate 100, in accordance with some embodiments.

As shown in FIG. 3, the source/drain portions 118 are not positioned in any fin structure of the semiconductor substrate 100, in accordance with some embodiments. As shown in FIG. 3, the source/drain portions 118 are positioned in the planar region of the semiconductor substrate 100, in accordance with some embodiments.

In some embodiments, since the etch stop layer does not cover the side surface of the upper portion of the spacer elements, there is more space for the formation of the contact plug. Therefore, the process window for the formation of the contact plug is enlarged. Therefore, in some embodiments, the manufacturing yield and/or the quality of the contact plug may improve.

In addition, in some embodiments, since the etch stop layer does not cover the side surface of the upper portion of the spacer elements, the dielectric constant between the contact plugs and the gate structures is reduced. Therefore, the RC delay would be reduced. In some embodiments, the performance of the semiconductor device structure is improved.

Embodiments of the disclosure can be applied to not only a semiconductor device structure with FinFETs but also a semiconductor device structure with planar FETs. Furthermore, embodiments of the disclosure are not limited and may be applied to fabrication processes for any suitable technology generation. Various technology generations include a 20 nm node, a 16 nm node, a 10 nm node, and other suitable nodes.

In accordance with some embodiments, a method for forming a semiconductor device structure is provided. The method includes providing a substrate. The method includes forming a gate structure over the substrate. The gate structure has a first sidewall. The method includes forming a spacer element over the first sidewall of the gate structure. The method includes forming a source/drain portion adjacent to the spacer element and the gate structure. The source/drain portion has a first top surface. The method includes depositing an etch stop layer over the first top surface of the source/drain portion. The etch stop layer is made of nitride. The method includes forming a dielectric layer over the etch stop layer. The dielectric layer has a second sidewall and a bottom surface, the etch stop layer is in direct contact with the bottom surface, and the spacer element is in direct contact with the second sidewall.

In accordance with some embodiments, a method for forming a semiconductor device structure is provided. The method includes providing a substrate. The method includes forming a gate structure over the substrate. The gate structure has a sidewall. The method includes forming a spacer element over the sidewall of the gate structure. The method includes forming a source/drain portion adjacent to the spacer element and the gate structure. The source/drain portion has a top surface. The method includes forming a nitride etch stop layer over the top surface of the source/drain portion. The nitride etch stop layer has a first sidewall. The method includes forming a dielectric layer over the etch stop layer. The dielectric layer has a second sidewall, the first sidewall and the second sidewall are substantially coplanar, and the first sidewall and the second sidewall both face the spacer element.

In accordance with some embodiments, a semiconductor device structure is provided. The semiconductor device structure includes a substrate. The semiconductor device structure includes a gate structure over the substrate. The gate structure has a first sidewall. The semiconductor device structure includes a spacer element over the first sidewall of the gate structure. The semiconductor device structure includes a source/drain portion in the substrate adjacent to the spacer element. The source/drain portion has a top surface. The semiconductor device structure includes an etch stop layer over the top surface of the source/drain portion. The etch stop layer is made of nitride. The semiconductor device structure includes a dielectric layer over the etch stop layer. The dielectric layer has a second sidewall and a bottom surface, the etch stop layer is in direct contact with the bottom surface, and the spacer element is in direct contact with the second sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
- a substrate;
- a gate structure over the substrate;
- a spacer element covering a first sidewall of the gate structure;
- a source/drain portion in the substrate, wherein the spacer element is between the source/drain portion and the gate structure;
- an etch stop layer covering the source/drain portion, wherein a topmost surface of the etch stop layer is closer to the substrate than a topmost surface of the gate structure, and the etch stop layer comprises:
  - a first nitride layer covering the source/drain portion and having a second sidewall, wherein the second sidewall is in direct contact with the spacer element; and
  - a first silicon layer covering the first nitride layer and having a third sidewall, wherein the third sidewall is in direct contact with the spacer element; and
- a dielectric layer over the etch stop layer, wherein the dielectric layer has a fourth sidewall and a bottom surface, the etch stop layer is in direct contact with the bottom surface, and the spacer element is in direct contact with the fourth sidewall.

2. The semiconductor device structure as claimed in claim 1, wherein the second sidewall and the third sidewall are substantially level with each other.

3. The semiconductor device structure as claimed in claim 1, wherein the first silicon layer is in direct contact with the first nitride layer.

4. The semiconductor device structure as claimed in claim 1, wherein the spacer element separates the gate structure from the etch stop layer.

5. The semiconductor device structure as claimed in claim 1, wherein the etch stop layer further comprises:
- a second nitride layer covering the first silicon layer.

6. The semiconductor device structure as claimed in claim 5, wherein the second nitride layer has a fourth sidewall, and the fourth sidewall is in direct contact with the spacer element.

7. The semiconductor device structure as claimed in claim 6, wherein the etch stop layer further comprises:
- a second silicon layer covering the second nitride layer.

8. The semiconductor device structure as claimed in claim 7, wherein the second silicon layer has a fifth sidewall, and the fifth sidewall is in direct contact with the spacer element.

9. The semiconductor device structure as claimed in claim 8, wherein the second sidewall, the third sidewall, the fourth sidewall, and the fifth sidewall are aligned with each other.

10. A semiconductor device structure, comprising:
- a substrate;
- a gate structure over the substrate;
- a spacer element covering a first sidewall of the gate structure;
- a source/drain portion in the substrate, wherein the spacer element separates the source/drain portion from the gate structure;
- a nitride layer over the source/drain portion and having a second sidewall, wherein the second sidewall faces the spacer element;
- a silicon layer over the nitride layer and having a third sidewall, wherein a topmost surface of the silicon layer is closer to the source/drain portion than a topmost surface of the spacer element, the third sidewall faces the spacer element, and the second sidewall is under and connected to the third sidewall; and
- a dielectric layer over the silicon layer, wherein the dielectric layer has a fourth sidewall and a bottom surface, the silicon layer is in direct contact with the bottom surface, and the spacer element is in direct contact with the fourth sidewall, the second sidewall, and the third sidewall.

11. The semiconductor device structure as claimed in claim 10, wherein
- the second sidewall of the nitride layer, the third sidewall of the silicon layer, and the fourth sidewall are aligned with each other.

12. The semiconductor device structure as claimed in claim 10, wherein the nitride layer is in direct contact with the source/drain portion.

13. The semiconductor device structure as claimed in claim 10, wherein the nitride layer is a first flat layer, and the silicon layer is a second flat layer.

14. The semiconductor device structure as claimed in claim 10, wherein the topmost surface of the spacer element, a topmost surface of the dielectric layer, and a topmost surface of the gate structure are substantially level with each other.

15. A semiconductor device structure, comprising:
- a substrate;
- a gate structure over the substrate;
- a spacer element covering a first sidewall of the gate structure;
- a nitride layer over the substrate and having a second sidewall;
- a silicon layer over the nitride layer and having a third sidewall, wherein a topmost surface of the silicon layer is lower than a topmost surface of the gate structure; and
- a dielectric layer over the silicon layer and having a fourth sidewall and a bottom surface, wherein the silicon layer is in direct contact with the bottom surface, and the second sidewall, the third sidewall, and the fourth sidewall are in direct contact with the spacer element.

16. The semiconductor device structure as claimed in claim 15, wherein the second sidewall is aligned with the third sidewall.

17. The semiconductor device structure as claimed in claim 15, wherein the second sidewall is connected to the third sidewall.

18. The semiconductor device structure as claimed in claim 15, further comprising:

a source/drain portion in the substrate and under the nitride layer.

19. The semiconductor device structure as claimed in claim 18, wherein a first crystallinity of the source/drain portion is greater than a second crystallinity of the spacer element.

20. The semiconductor device structure as claimed in claim 15, wherein a topmost surface of the spacer element, a topmost surface of the dielectric layer, and the topmost surface of the gate structure are substantially level with each other.

* * * * *